(12) United States Patent
Chu

(10) Patent No.: US 7,800,431 B2
(45) Date of Patent: Sep. 21, 2010

(54) INTERNAL VOLTAGE GENERATION CIRCUIT

(75) Inventor: Shin Ho Chu, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 98 days.

(21) Appl. No.: 11/821,600

(22) Filed: Jun. 25, 2007

(65) Prior Publication Data

US 2008/0159047 A1 Jul. 3, 2008

(30) Foreign Application Priority Data

Dec. 29, 2006  (KR) ...................... 10-2006-0138777

(51) Int. Cl.
*G11C 5/14* (2006.01)
(52) U.S. Cl. ...................................... 327/530; 327/538
(58) Field of Classification Search .................. 327/530, 327/538, 536
See application file for complete search history.

(56) References Cited

U.S. PATENT DOCUMENTS

| 6,879,540 | B2 * | 4/2005 | Maruyama et al. ...... 365/189.03 |
| 7,031,219 | B2 | 4/2006 | Hsu et al. |
| 7,227,794 | B2 | 6/2007 | Kang |
| 7,292,494 | B2 * | 11/2007 | Hsu et al. .................. 365/226 |

FOREIGN PATENT DOCUMENTS

KR   10-2006-0040396 A   5/2006

* cited by examiner

*Primary Examiner*—Quan Tra
(74) *Attorney, Agent, or Firm*—John P. White; Cooper & Dunham LLP

(57) ABSTRACT

Various examples of internal voltage generation circuit are provided. In one example, the internal voltage generation circuit includes a level control signal generator for generating a level control signal in response to a power down mode signal, which is activated synchronously with a clock enable signal, and a precharge flag signal, which is enabled when a precharge operation, is performed, and an internal voltage generator for generating an internal voltage in response to the level control signal and outputting it to an output node.

11 Claims, 4 Drawing Sheets

INTERNAL VOLTAGE GENERATION CIRCUIT

BACKGROUND

The present disclosure relates to an internal voltage generation circuit, and more particularly to an internal voltage generation circuit which is capable of reducing power consumption in a power down mode.

Generally, in a dynamic random access memory (DRAM), a power down mode Powerdown is supported in which the operations of an internal clock and a buffer are stopped in response to a clock enable signal CKE to drop power consumption to a predetermined level or lower. The power down mode becomes a main issue, particularly in mobile fields including a mobile phone, personal digital assistant (PDA), etc., because it is important in the mobile fields to reduce power consumption.

In the case of an internal voltage Vperi which is supplied to a peri area, it is preferred, in consideration of speed characteristics, to use a voltage of the same level as that of an external voltage Vdd, as the internal voltage Vperi. However, the use of the internal voltage Vperi of the same level as that of the external voltage Vdd results in leakage current increasing as the external voltage Vdd increases.

On the other hand, in order to avoid leakage current, a voltage of a level lower than that of the external voltage Vdd may be used as the internal voltage Vperi. In this case, there is another problem that speed characteristics of the respective circuits deteriorate due to the level down of internal operating voltages.

BRIEF SUMMARY

In an aspect of the present invention, an internal voltage generation circuit comprises a level control signal generator for generating a level control signal in response to a power down mode signal which is activated synchronously with a clock enable signal and a precharge flag signal which is enabled when a precharge operation is performed, and an internal voltage generator for generating an internal voltage in response to the level control signal and outputting it to an output node.

The level control signal may be enabled when both the power down mode signal and precharge flag signal are enabled.

The internal voltage generator may be activated in response to the level control signal.

Preferably, the level control signal generator comprises a first logic circuit configured to receive the power down mode signal and the precharge flag signal and perform a logic operation with respect to the received signals, a second logic circuit configured to receive an output signal from the first logic circuit and the clock enable signal and perform a logic operation with respect to the received signals, and a latch circuit configured to receive and latch an output signal from the second logic circuit and the clock enable signal and generate the level control signal.

The first logic circuit may perform a NAND operation.

The second logic circuit may perform an OR operation.

Preferably, the internal voltage generation circuit further comprises a switch for transferring an external voltage to the output node in response to the level control signal.

The switch may be a PMOS transistor, the PMOS transistor being connected between the output node and an external voltage supply terminal.

In another aspect of the present invention, an internal voltage generation circuit comprises a level control signal generator for generating a level control signal in response to a control signal, and an internal voltage generator for generating an internal voltage in response to the level control signal and outputting it to an output node.

The control signal may be a power down mode signal which is activated synchronously with a clock enable signal or a precharge flag signal which is enabled when a precharge operation is performed.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Preferred embodiments of the present invention will now be described in detail with reference to the accompanying drawings.

An internal voltage generation circuit of the present disclosure is configured to generate and use an internal voltage Vperi of a level lower than that of an external voltage Vdd in a precharge power down mode, thus reducing current consumption, and to generate and use an internal voltage Vperi of the same level as that of the external voltage Vdd when the power down mode is terminated or an active command is inputted, thereby improving speed characteristics.

Figure 1:
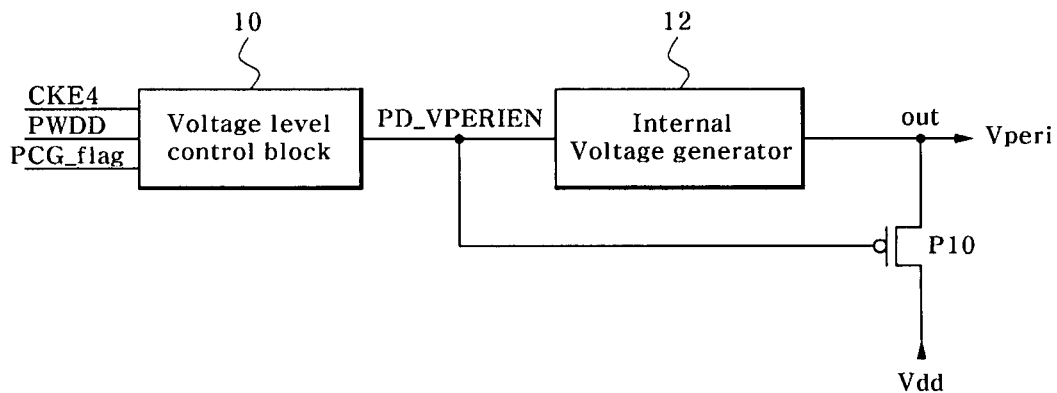
FIG. 1 is a view showing the configuration of an internal voltage generation circuit according to a first embodiment of the present invention.

FIG. 1 shows the configuration of an internal voltage generation circuit according to a first embodiment of the present invention.

As shown in FIG. 1, the internal voltage generation circuit according to the present embodiment comprises a level control signal generator 10, an internal voltage generator 12, and a PMOS transistor P10.

Figure 2:
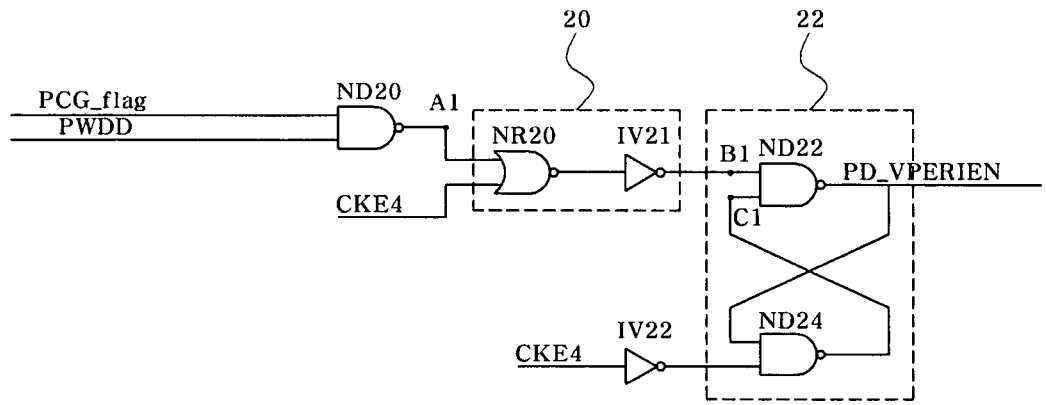
FIG. 2 is a circuit diagram of a level control signal generator in FIG. 1.

The level control signal generator 10 includes, as shown in FIG. 2, a NAND gate ND20 configured to receive a precharge flag signal PCG_flag which is enabled when a precharge operation is performed and an inverted signal of a power down mode signal PWDD which is activated synchronously with a clock enable signal CKE4, and perform a NAND operation with respect to the received signals, a logic circuit 20 configured to receive an output signal from the NAND gate ND20 and the clock enable signal CKE4 and perform an OR operation with respect to the received signals, and a latch circuit 22 configured to receive an output signal from the logic circuit 20 and the clock enable signal CKE4 and generate a level control signal PD_VPERIEN.

The precharge flag signal PCG_flag is a flag indicating whether a semiconductor device is in a precharge state or in an active state, and assumes a high level when the semiconductor device is in the precharge state and a low level when the semiconductor device is in the active state. The power down mode signal PWDD is a flag signal indicating whether the semiconductor device has entered a power down mode, and is enabled high in level in response to a clock enable signal CKE of a low level.

The internal voltage generator 12 is controlled by the level control signal PD_VPERIEN to generate an internal voltage Vperi and output it to a node A. The internal voltage generator 12 is preferably configured to include an existing internal voltage generation circuit (not shown), and a switch (not shown) for controlling activation of the internal voltage generation circuit in response to the level control signal PD_VPERIEN. Here, the internal voltage generation circuit is adapted to generate an internal voltage of a level lower than that of an external voltage Vdd, and may be implemented by an existing internal voltage Vperi generation circuit. The switch may be implemented to perform an operation of transferring an internal voltage Vperi generated in response to the level control signal PD_VPERIEN of a high level to the node A and preventing an internal voltage Vperi generated in response to the level control signal PD_VPERIEN of a low level from being transferred to the node A.

The PMOS transistor P10 is connected between an output node out and the external voltage Vdd to transfer the external voltage Vdd to the output node out in response to the level control signal PD_VPERIEN. Namely, where the level control signal PD_VPERIEN of the low level is inputted, the internal voltage Vperi which is outputted at the output node out is the same as the external voltage Vdd.

The operation of the internal voltage generation circuit with the above-stated configuration according to the present embodiment will hereinafter be described in detail.

Figure 3:
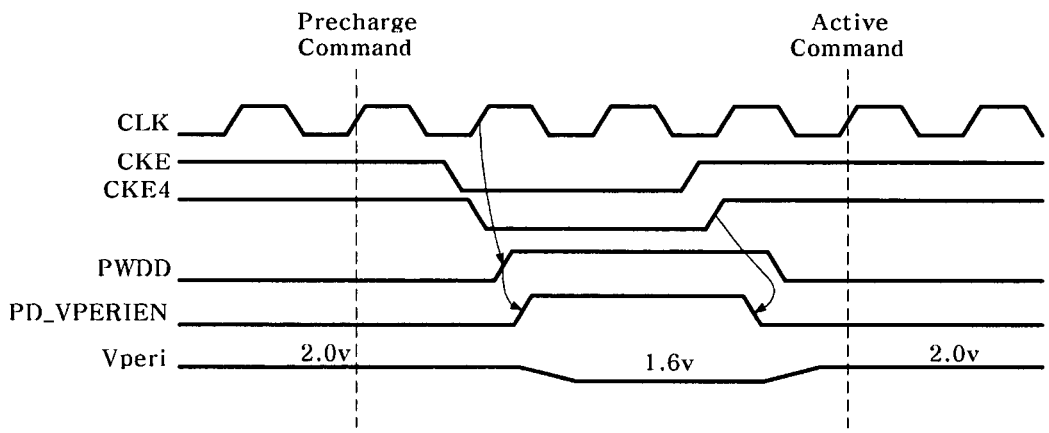
FIG. 3 is a timing diagram of internal signals in FIG. 2.

As shown in FIG. 3, before a precharge command is inputted, the clock enable signal CKE4 is high in level and the power down mode signal PWDD and the precharge flag signal PCG_flag (not shown) are low in level. As a result, a node A1 and a node B1 go high in level. At this time, a node C1 makes a low to high level transition based on the clock enable signal CKE4 of the high level, thereby causing the level control signal PD_VPERIEN from a NAND gate ND22 to become low in level. The PMOS transistor P10 is turned on by the level control signal PD_VPERIEN of the low level. At this time, the level control signal PD_VPERIEN of the low level is also inputted to the internal voltage generator 12, so as to stop driving the internal voltage generator 12. Consequently, the internal voltage Vperi which is outputted at the output node out is the same as the external voltage Vdd, 2.0V.

At the time that the clock enable signal CKE4 makes a high to low level transition after the precharge command is inputted, the semiconductor device, such as a DRAM, enters a precharge power down mode Precharge-Powerdown. In more detail, when the precharge command is inputted, the precharge flag signal PCG_flag makes a low to high level transition. Also, the clock enable signal CKE4 goes from high to low in level and the power down mode signal PWDD goes from low to high in level. At this time, the node A1 becomes low in level by the precharge flag signal PCG_flag of the high level and the power down mode signal PWDD of the high level, and the node B1 also becomes low in level by the node A1 of the low level and the clock enable signal CKE4 of the low level. As a result, the level control signal PD_VPERIEN from the NAND gate ND22 becomes high in level. The level control signal PD_VPERIEN of the high level is transferred to the PMOS transistor P10, so as to turn off the PMOS transistor P10. At this time, the level control signal PD_VPERIEN of the high level is also inputted to the internal voltage generator 12, so that the internal voltage generator 12 is enabled to generate an internal voltage Vperi, 1.6V, and output it to the output node out.

Thereafter, at the time that the power down mode Powerdown is terminated, the power down mode signal PWDD is disabled low in level, so that the node A1 and node B1 go high in level. At this time, the clock enable signal CKE4 becomes high in level, thereby causing the node C1 to go high in level. As a result, the level control signal PD_VPERIEN from the NAND gate ND22 becomes low in level. The PMOS transistor P10 is turned on by the level control signal PD_VPERIEN of the low level. At this time, the level control signal PD_VPERIEN of the low level is also inputted to the internal voltage generator 12, so as to stop driving the internal voltage generator 12. Consequently, the internal voltage Vperi which is outputted at the output node out is the same as the external voltage Vdd, 2.0V.

Figure 4:
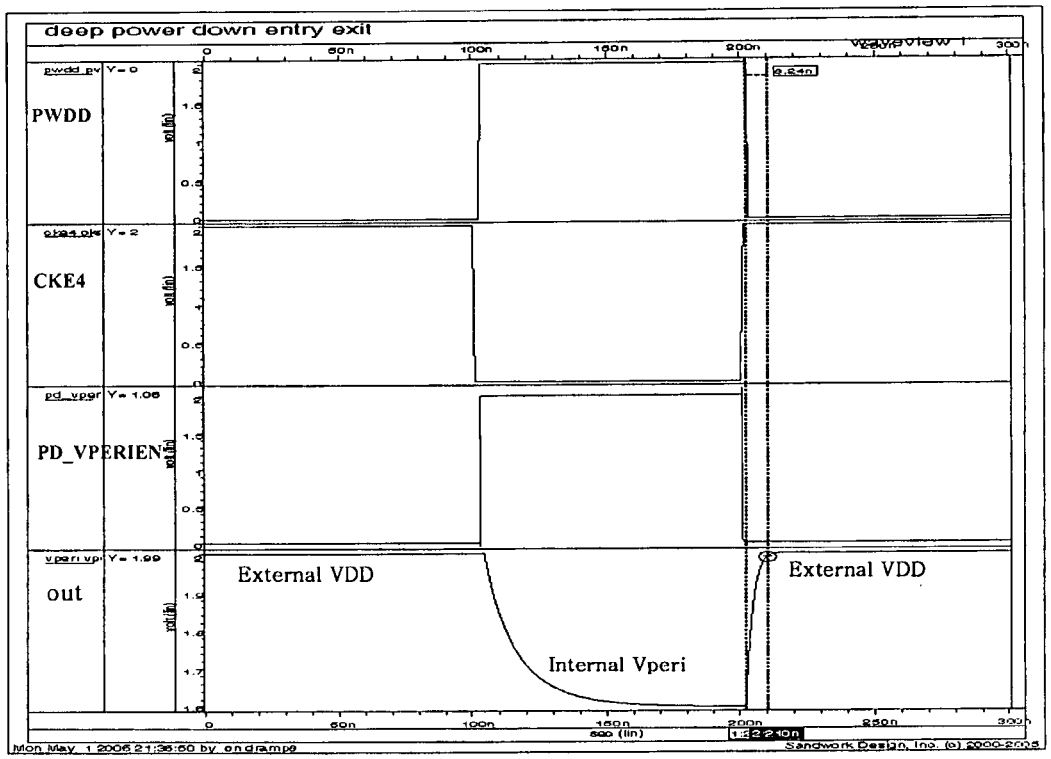
FIG. 4 is a waveform diagram illustrating simulation results of the circuit of FIG. 1, when a power down mode is terminated.

Referring to FIG. 4 that illustrates simulation results when the power down mode is terminated, it can be seen that the voltage at the output node out becomes the internal voltage Vperi, 1.6V, in the precharge power down mode Precharge-Powerdown and the external voltage Vdd, 2.0V after the power down mode is terminated.

On the other hand, if an active command is inputted in the precharge power down mode Precharge-Powerdown, then the DRAM enters an active power down mode Active-Powerdown. In the active power down mode Active-Powerdown, there is an electrical current margin in terms of specifications, and a read or write operation with high internal voltage Vperi consumption may be performed immediately after the power down mode is terminated. In this regard, in the active power down mode Active-Powerdown, the internal voltage which is outputted at the output node out is preferably the external voltage Vdd, 2.0V. For such an operation, the present embodiment employs the precharge flag signal PCG_flag which is disabled low in level in response to the active command.

This operation will hereinafter be described in detail with reference to FIG. 2. The node A1 and the node B1 sequentially go high in level by the precharge flag signal PCG_flag disabled low in level in response to the active command. At this time, because the clock enable signal CKE4 is high in level, the node C1 becomes high in level, and the NAND gate ND22 receives the high-level signals from the node B1 and node C1 and outputs the level control signal PD_VPERIEN of the low level. The level control signal PD_VPERIEN of the low level is transferred to the PMOS transistor P10, so as to turn on the PMOS transistor P10. At this time, the level control signal PD_VPERIEN of the low level is also inputted to the internal voltage generator 12, so as to stop driving the internal voltage generator 12. Consequently, the internal voltage Vperi which is outputted at the output node out is the same as the external voltage Vdd, 2.0V.

Figure 5:
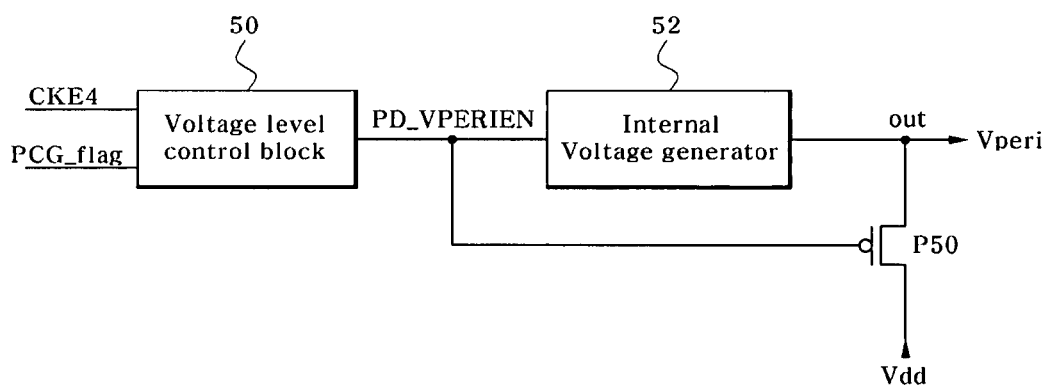
FIG. 5 is a view showing the configuration of an internal voltage generation circuit according to a second embodiment of the present invention.

FIG. 5 shows the configuration of an internal voltage generation circuit according to a second embodiment of the present disclosure.

As shown in FIG. 5, the internal voltage generation circuit according to the present embodiment comprises a level control signal generator 50, an internal voltage generator 52, and a PMOS transistor P50.

Figure 6:
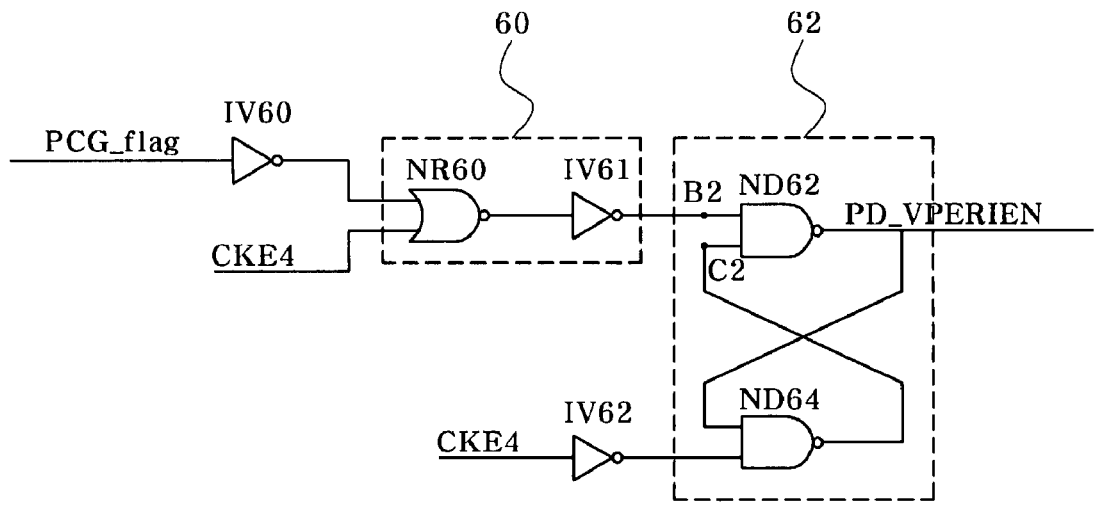
FIG. 6 is a circuit diagram of a level control signal generator in FIG. 5.

The level control signal generator 50 includes, as shown in FIG. 6, an inverter IV60 for receiving and inverting a precharge flag signal PCG_flag which is enabled when a precharge operation is performed, a logic circuit 60 configured to receive an output signal from the inverter IV60 and a clock enable signal CKE4 and perform an OR operation with respect to the received signals, and a latch circuit 62 configured to receive and latch an output signal from the logic circuit 60 and the clock enable signal CKE4 and generate a level control signal PD_VPERIEN.

The internal voltage generator 52 is controlled by the level control signal PD_VPERIEN to generate an internal voltage Vperi. The internal voltage generator 52 is driven when the level control signal PD_VPERIEN of a high level is inputted thereto, and the driving thereof is stopped when the level control signal PD_VPERIEN of a low level is inputted thereto.

The PMOS transistor P50 is connected between an output node out and the external voltage Vdd to transfer the external voltage Vdd to the output node out in response to the level control signal PD_VPERIEN. That is, where the level control signal PD_VPERIEN of the low level is inputted, the internal voltage Vperi which is outputted at the output node out is the same as the external voltage Vdd.

The operation of the internal voltage generation circuit with the above-stated configuration according to the present embodiment will hereinafter be described in detail.

Before a precharge command is inputted, the clock enable signal CKE4 is high in level and the precharge flag signal PCG_flag (not shown) is low in level. As a result, a node B2 goes high in level, and a node C2 makes a low to high level transition based on the clock enable signal CKE4 of the high level, thereby causing the level control signal PD_VPERIEN from a NAND gate ND62 to become low in level. The PMOS transistor P50 is turned on by the level control signal PD_VPERIEN of the low level. At this time, the level control signal PD_VPERIEN of the low level is also inputted to the internal voltage generator 52, so as to stop driving the internal voltage generator 52. Consequently, the internal voltage Vperi which is outputted at the output node out is the same as the external voltage Vdd, 2.0V.

At the time that the clock enable signal CKE4 makes a high to low level transition after the precharge command is inputted, a semiconductor device, such as a DRAM, enters a precharge power down mode Precharge-Powerdown. In more detail, when the precharge command is inputted, the precharge flag signal PCG_flag makes a low to high level transition and the clock enable signal CKE4 makes a high to low level transition. Because the low-level output signal from the inverter IV60 and the low-level clock enable signal CKE4 are inputted to the logic circuit 60, the node B2 becomes low in level, thereby causing the level control signal PD_VPERIEN from the NAND gate ND62 to become high in level. The level control signal PD_VPERIEN of the high level is transferred to the PMOS transistor P50, so as to turn off the PMOS transistor P50. At this time, the level control signal PD_VPERIEN of the high level is also inputted to the internal voltage generator 52, so that the internal voltage generator 52 is enabled to generate an internal voltage Vperi, 1.6V, and output it to the output node out.

On the other hand, if an active command is inputted in the precharge power down mode Precharge-Powerdown, then the node B2 goes high in level by the precharge flag signal PCG_flag disabled low in level in response to the active command. At this time, because the clock enable signal CKE4 is high in level, the node C2 becomes high in level, and the NAND gate ND62 receives the high-level signals from the node B2 and node C2 and outputs the level control signal PD_VPERIEN of the low level. The level control signal PD_VPERIEN of the low level is transferred to the PMOS transistor P50, so as to turn on the PMOS transistor P50. At this time, the level control signal PD_VPERIEN of the low level is also inputted to the internal voltage generator 52, so as to stop driving the internal voltage generator 52. Consequently, the internal voltage Vperi which is outputted at the output node out is the same as the external voltage Vdd, 2.0V.

Figure 7:
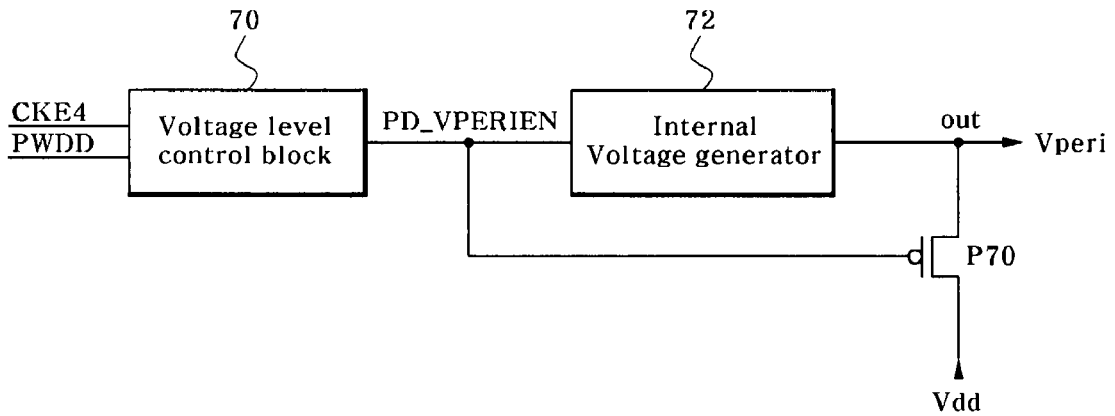
FIG. 7 is a view showing the configuration of an internal voltage generation circuit according to a third embodiment of the present invention.

FIG. 7 shows the configuration of an internal voltage generation circuit according to a third embodiment of the present disclosure.

As shown in FIG. 7, the internal voltage generation circuit according to the present embodiment comprises a level control signal generator 70, an internal voltage generator 72, and a PMOS transistor P70.

Figure 8:
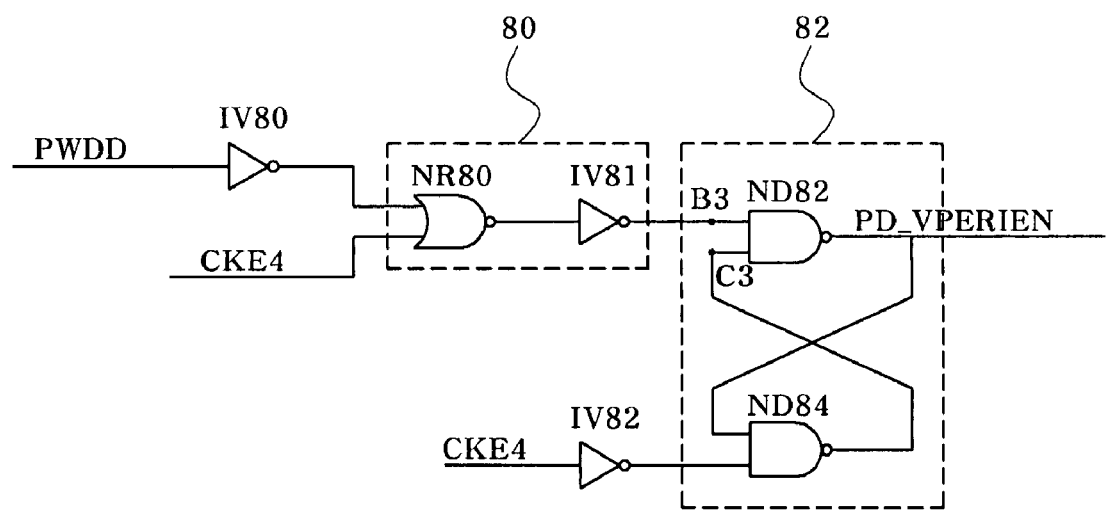
FIG. 8 is a circuit diagram of a level control signal generator in FIG. 7.

The level control signal generator 70 includes, as shown in FIG. 8, an inverter IV80 configured to receive and invert a power down mode signal PWDD which is activated synchronously with a clock enable signal CKE4, a logic circuit 80 configured to receive an output signal from the inverter IV80 and the clock enable signal CKE4 and perform an OR operation with respect to the received signals, and a latch circuit 82 configured to receive an output signal from the logic circuit 80 and the clock enable signal CKE4 and generate a level control signal PD_VPERIEN.

The internal voltage generator 72 is controlled by the level control signal PD_VPERIEN to generate an internal voltage Vperi. The internal voltage generator 72 is driven when the level control signal PD_VPERIEN of a high level is inputted thereto, and the driving thereof is stopped when the level control signal PD_VPERIEN of a low level is inputted thereto.

The PMOS transistor P70 is connected between an output node out and the external voltage Vdd to transfer the external voltage Vdd to the output node out in response to the level control signal PD_VPERIEN. That is, where the level control signal PD_VPERIEN of the low level is inputted, the internal voltage Vperi which is outputted at the output node out is the same as the external voltage Vdd.

The operation of the internal voltage generation circuit with the above-stated configuration according to the present embodiment will hereinafter be described in detail.

Before a power down mode Powerdown is entered, the clock enable signal CKE4 is high in level and the power down mode signal PWDD is low in level. As a result, a node B3 goes high in level, and a node C3 makes a low to high level transition based on the clock enable signal CKE4 of the high level, thereby causing the level control signal PD_VPERIEN from a NAND gate ND82 to become low in level. The PMOS transistor P70 is turned on by the level control signal PD_VPERIEN of the low level. At this time, the level control signal PD_VPERIEN of the low level is also inputted to the internal voltage generator 72, so as to stop driving the internal voltage generator 72. Consequently, the internal voltage Vperi which is outputted at the output node out is the same as the external voltage Vdd, 2.0V.

At the time that the power down mode Powerdown is entered, the clock enable signal CKE4 goes from high to low in level and the power down mode signal PWDD goes from low to high in level synchronously with the clock enable signal CKE4. Because the low-level output signal from the inverter IV80 and the low-level clock enable signal CKE4 are inputted to the logic circuit 80, the node B3 becomes low in level, thereby causing the level control signal PD_VPERIEN from the NAND gate ND82 to become high in level. The level control signal PD_VPERIEN of the high level is transferred to the PMOS transistor P70, so as to turn off the PMOS transistor P70. At this time, the level control signal PD_VPERIEN of the high level is also inputted to the internal voltage generator 72, so that the internal voltage generator 72 is enabled to generate an internal voltage Vperi, 1.6V, and output it to the output node out. Consequently, the internal voltage Vperi which is outputted at the output node out is the same as the internal voltage Vperi, 1.6V.

Thereafter, when the power down mode Powerdown is terminated, the power down mode signal PWDD is disabled low in level, so that the node B3 becomes high in level. At this time, the clock enable signal CKE4 goes high in level, thereby causing the node C3 to go high in level. As a result, the level control signal from the NAND gate ND82 becomes low in level. The PMOS transistor P70 is turned on by the level control signal PD_VPERIEN of the low level. At this time, the level control signal PD_VPERIEN of the low level is also inputted to the internal voltage generator 72, so as to stop driving the internal voltage generator 72. Consequently, the internal voltage Vperi which is outputted at the output node out is the same as the external voltage Vdd, 2.0V.

Although the various preferred embodiments of the internal voltage generation circuit as discussed herein in connection with the preferred embodiments for illustrative purposes generates an internal voltage in the power down mode, it is widely applicable to various devices that generate different levels of voltages according to different operation modes.

Also, although the switch P10, P50 or P70 has been discussed in connection with the various preferred embodiments as being installed inside the internal voltage generation circuit, it will be understood that the switch may be installed outside the voltage generation circuit or in any other fashions.

Although the preferred embodiments of the present disclosure have been disclosed for illustrative purposes, those skilled in the art will appreciate that various modifications, additions and substitutions are possible, without departing from the scope and spirit of the disclosure and the accompanying claims.

The present application claims priority to Korean patent application number 10-2006-138777, filed Dec. 29, 2006 which is incorporated herein by reference in its entirety.

What is claimed is:

1. An internal voltage generation circuit of a semiconductor device, comprising:
   a first logic circuit configured to receive a power down mode signal and a precharge flag signal, and generate a first output signal, the power down mode signal being enabled in a power down mode, the precharge flag signal being enabled in a precharge mode and disabled in an active mode, and the first output signal being enabled when the power down mode signal and the precharge flag signal are enabled;
   a second logic circuit configured to receive the first output signal and a clock enable signal, and generate a second output signal, the clock enable signal being disabled in the power down mode causing an internal clock of the semiconductor device to stop, to reduce power consumption, and the second output signal being enabled when the first output signal is enabled and the clock enable signal is disabled;
   a latch circuit configured to receive the second output signal and an inverted signal of the clock enable signal, and generate a level control signal, the level control signal being enabled when the second output signal is enabled, and being disabled when the clock enable signal is enabled; and
   an internal voltage generator for generating an internal voltage in response to the level control signal and outputting said internal voltage to an output node.

2. The internal voltage generation circuit according to claim 1, wherein the internal voltage generator is activated in response to the level control signal.

3. The internal voltage generation circuit according to claim 1, wherein the first logic circuit performs a NAND operation.

4. The internal voltage generation circuit according to claim 1, wherein the second logic circuit performs an OR operation.

5. The internal voltage generation circuit according to claim 1, further comprising a switch for transferring an external voltage to the output node in response to the level control signal.

6. The internal voltage generation circuit according to claim 5, wherein the switch is a PMOS transistor, the PMOS transistor being connected between the output node and an external voltage supply terminal.

7. An internal voltage generation circuit of a semiconductor device comprising:
   a first logic circuit configured to invert a precharge flag signal, and generate a first output signal, the precharge flag signal being enabled in a precharge mode and disabled in an active mode, and the first output signal being enabled when the precharge flag signal is enabled;
   a second logic circuit configured to receive the first output signal and a clock enable signal, and generate a second output signal, the clock enable signal being disabled in a power down mode causing an internal clock of the semiconductor memory device to stop, to reduce power consumption, and the second output signal being enabled when the first output signal is enabled and the clock enable signal is disabled;
   a latch circuit configured to receive the second output signal and an inverted signal of the clock enable signal, and generate a level control signal, the level control signal being enabled when the second output signal is enabled, and being disabled when the clock enable signal is enabled; and
   an internal voltage generator for generating an internal voltage in response to the level control signal and outputting said internal voltage to an output node.

8. The internal voltage generation circuit according to claim 7, wherein the internal voltage generator is activated in response to the level control signal.

9. The internal voltage generation circuit according to claim 7, wherein the logic circuit performs an OR operation.

10. The internal voltage generation circuit according to claim 7, further comprising a switch for transferring an external voltage to the output node in response to the level control signal.

11. The internal voltage generation circuit according to claim 10, wherein the switch is a PMOS transistor, the PMOS transistor being connected between the output node and an external voltage supply terminal.

* * * * *